United States Patent [19]

Nakatani

[11] Patent Number: 5,240,869
[45] Date of Patent: Aug. 31, 1993

[54] METHOD FOR FABRICATING A FIELD EFFECT TRANSISTOR

[75] Inventor: Mitsunori Nakatani, Itami, Japan

[73] Assignee: Mitsubishi Denki Kabushiki Kaisha, Tokyo, Japan

[21] Appl. No.: 785,109

[22] Filed: Oct. 30, 1991

[30] Foreign Application Priority Data

Oct. 30, 1990 [JP] Japan .................. 2-296634

[51] Int. Cl.⁵ ........................... H01L 21/265
[52] U.S. Cl. ........................... 437/41; 437/40; 437/912; 437/203
[58] Field of Search ............. 437/40, 41, 912; 357/68

[56] References Cited

U.S. PATENT DOCUMENTS

| | | | |
|---|---|---|---|
| 4,472,872 | 9/1984 | Toyoda et al. | 29/571 |
| 4,889,827 | 12/1989 | Willer | 437/41 |
| 4,981,809 | 1/1991 | Mitsuaki et al. | 437/912 |
| 5,032,541 | 7/1991 | Sakamoto et al. | 437/912 |

FOREIGN PATENT DOCUMENTS

| | | |
|---|---|---|
| 0064745 | 11/1982 | European Pat. Off. . |
| 0113161 | 7/1984 | European Pat. Off. . |
| 0308939 | 3/1989 | European Pat. Off. . |
| 62-79677 | 4/1987 | Japan . |
| 0015475 | 1/1988 | Japan ........ 437/40 |
| 63-81865 | 4/1988 | Japan . |
| 3287069 | 11/1988 | Japan . |
| 64-53467 | 3/1989 | Japan . |
| 1-175772 | 7/1989 | Japan . |
| 2-36653 | 2/1990 | Japan . |
| 2307231 | 12/1990 | Japan . |
| 3046340 | 2/1991 | Japan ........ 437/912 |
| 3-184334 | 8/1991 | Japan . |
| 3187232 | 8/1991 | Japan . |

Primary Examiner—Olik Chaudhuri
Assistant Examiner—Long Pham
Attorney, Agent, or Firm—Leydig, Voit & Mayer

[57] ABSTRACT

A method for fabrication a field effect transistor having a T-shaped gate electrode in a stepped recess includes forming an active layer in a substrate, forming two spaced apart ohmic electrodes on the active layer, forming spaced apart first side wall films on side walls of and between the two ohmic electrodes, forming a first recess by etching the active layer using the first side wall films as a mask, forming spaced apart second side wall films in the first recess contacting the first side wall films, forming a second recess narrower than and within the first recess by etching the active layer using the second side wall films as a mask, and forming a T-shaped gate in the second recess in contact with the second side wall films.

18 Claims, 6 Drawing Sheets

METHOD FOR FABRICATING A FIELD EFFECT TRANSISTOR

FIELD OF THE INVENTION

The present invention relates to a method for fabricating a semiconductor device and, more particularly, to a method for fabricating a field effect transistor having a gate electrode in a stepped recess.

BACKGROUND OF THE INVENTION

Field effect transistors (FET's) employing compound semiconductors, such as gallium arsenide (GaAs) or indium phosphide (InP) are useful as high frequency transistors because electron mobilities in these compound semiconductors are relatively high.

Recently, FET's having a gate electrode formed in a recess of an active layer have been employed to realize a high breakdown voltage and high speed operation.

Figure 7A:
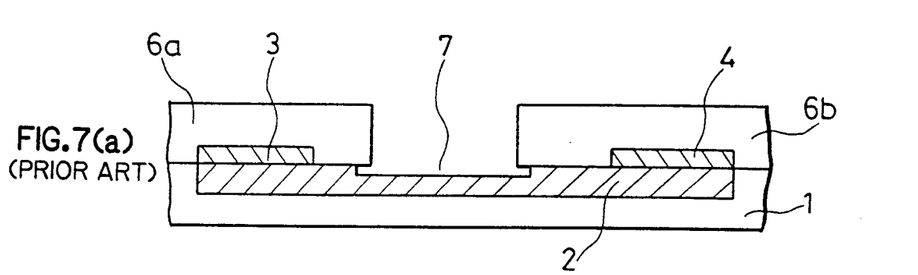
FIGS. 7(a) to 7(c) are cross-sectional views showing major steps for fabricating a conventional FET.
Figure 7B:
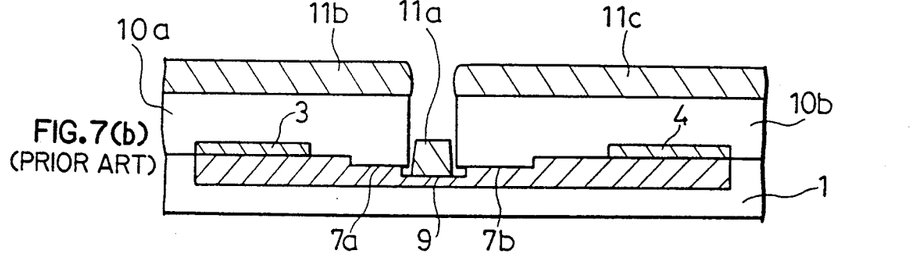
Figure 7C:
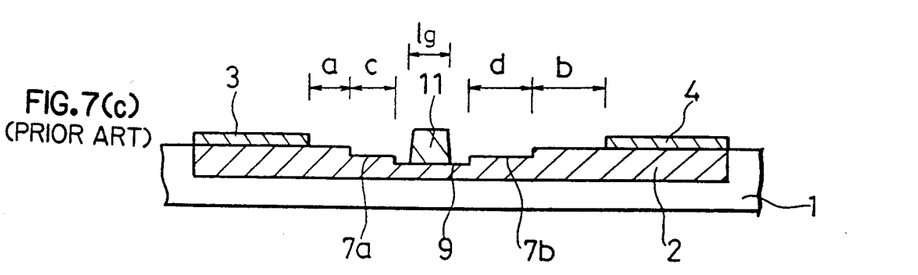

A method for fabricating a conventional FET having a gate electrode formed in a stepped recess of an active layer (hereinafter referred to as a stepped recess gate structure) is illustrated in FIGS. 7(a) and 7(c). In FIG. 7C, a semi-insulating substrate 1 is formed of GaAs or the like. An active layer 2 is formed on a surface of the substrate 1. A source electrode 3 and a drain electrode 4 are formed of metal in ohmic contact with the substrate 1. Reference numerals 7 7a, and 7b designate an upper stepped recess and reference numeral 9 designates a lower stepped recess. Resists 6a and 6b are used for forming the upper stepped recess 7 and resists 10a and 10b are used for forming the lower stepped recess 9. Gate electrode metal 11a, 11b and 11c form A Schottky contact with the substrate 1 and a gate electrode 11 is produced from the gate electrode metal 11a.

The fabricating method will be described.

First, as shown in FIG. 7(a), an active layer 2 is produced at a desired position in a semi-insulating substrate 1 by ion implantation or epitaxial growth. Then, a source electrode 3 and a drain electrode 4 are formed on the active layer 2 in ohmic contact with the active layer 2 and patterns of photoresist 6a and 6b are formed for etching a part of the active layer 2 between the source electrode 3 and the drain electrode 4. Then, an upper stepped recess 7 is formed by etching.

Next, as shown in FIG. 7(b), patterns of photoresist 10a and 10b are formed for further etching a part of the active layer 2 at the surface of the upper stepped recess 7 and then a lower stepped recess 9 is formed. Thereafter, gate electrode metals 11b, 11c and 11a are deposited on the resist patterns 10a and 10b and the lower stepped recess 9, respectively, separated from each other.

Next, as shown in FIG. 7(c), the resist patterns 10a and 10b and the gate electrode metals 11b and 11c are removed by lift-off leaving gate electrode metal 11a as the gate electrode 11 on the lower stepped recess 9. Thus, an FET having a stepped recess gate structure is completed.

In this fabricating method, alignment of the resist patterns 6a and 6b and 10a and 10b with the substrate 1 is shifted to some degree by the exposure apparatus. For example, as shown in FIG. 7(c), when the distance between an end of the source electrode 3 and the upper stepped recess 7 and the distance between an end of the drain electrode 4 and the upper stepped recess 7 are indicated by a and b, respectively, and the width of the upper stepped recess 7 on the side of the source electrode 3 and the width of the upper stepped recess 7 on the side of the drain electrode 4 are indicated by c and d, respectively, even when the condition that a=b and c=d is required, the following relations $$|a-b| \leq \alpha$$

$$|c-d| \leq \alpha$$

result due to the shift of alignment, where ±a is mask alignment precision of the exposure apparatus.

When $\alpha = \pm 0.3$ micron, in order to satisfy the condition that a, b, c, d>0, i.e., in order to prevent the source electrode 3 and the drain electrode 4 from overlapping with the pattern of the upper stepped recess 7, they should be spaced apart from each other by $2\alpha$ (=0.6 micron) or more. Further, in order to prevent the patterns of the upper stepped recess 7 and the lower stepped recess 9 from overlapping, the width of the lower stepped recess 9 should be $2\alpha$ (=0.6 micron) or more and the widths of the upper stepped recesses 7a and 7b should be $2\alpha$ (=0.6 micron) or more. Overall, the source electrode 3 and the drain electrode 4 each have to be formed relative to the gate electrode 11 with an alignment margin of at least $4\alpha$ (=1.2 micron). This is a great problem for a semiconductor device in which a good high frequency characteristic is desired.

In addition, the length of the gate electrode on the lower stepped recess 9 in the direction between the source electrode 3 and the drain electrode 4 is indicated by lg. Since a reduction in the gate length significantly contributes to improved speed and an improved high efficiency of shortening of the gate length is desired. However, according to the conventional fabricating method, since the gate electrode is formed by lift-off using the thick resist films 10a and 10b having an opening at the lower stepped recess 9 as a mask, the section of the gate electrode 11 gradually changes from a trapezoid to a triangle configuration with a reduction in the gate length lg, so that the gate area is reduced and the gate resistance is abruptly increased. This results in limitations on the increase in speed of the FET and also reduces in reliability due to heat generation at the gate electrode.

As described above, while the stepped recess FET is a structure that should enhance the breakdown voltage and efficiency and has generally been used for high power output FETs, the above-described fabrication steps for the conventional stepped recess FET have made it difficult to shorten the source electrode to gate electrode distance and the drain electrode to gate electrode distance due to the mask alignment precision of the exposure apparatus and to improve speed above a certain value. In addition, the miniaturization of the gate electrode 11 increases the gate resistance, thereby obstructing a high frequency operation and reliability is also reduced due to heat generation.

SUMMARY OF THE INVENTION

It is an object of the present invention to provide a method for fabricating a semiconductor device that includes forming ohmic electrodes and an upper and a lower stepped recess in a self-alignment manner that is symmetrical with respect to a gate electrode and that reduces gate electrode-to-ohmic electrodes distance, reduces gate resistance and gate length, and enhances reliability.

It is another object of the present invention to provide a method for fabricating a semiconductor device that includes forming a gate electrode and an upper and a lower stepped recess in a self-alignment manner spaced from ohmic electrodes at predetermined offset intervals, that reduce gate electrode-to-ohmic electrodes distance, reduces gate resistance and gate length, and enhances reliability. A reduced gate-to-source resistance and an improved gate-to-drain breakdown voltage are also obtained.

It is another object of the present invention to provide a method for fabricating a semiconductor device including forming a gate electrode and a source electrode in a self-alignment manner with a reduced distance between them.

It is a still further object of the present invention to provide a method for fabricating a semiconductor device that includes forming an upper stepped recess in a self-alignment manner with an ohmic electrode, reduces gate electrode-to-ohmic electrodes distance and reduces gate electrode-to-ohmic electrode resistance.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a method of the present invention for fabricating a semiconductor device, an active layer is formed on a substrate, two ohmic electrodes are formed on the active layer, first side wall films are formed at both sides of the ohmic electrodes, an upper stepped recess is formed by etching the active layer using the first side wall films as a mask, a second side wall films are formed in the upper stepped recess adjacent the first side wall films, a lower stepped recess is formed by etching the upper stepped recess using the second side wall films as a mask, and a T-shaped gate is formed on the lower stepped recess and on the second side wall films.

According to a method for fabricating a semiconductor device of the present invention, the thicknesses of the two ohmic electrodes are different.

In addition, according to a method of the present invention for fabricating a semiconductor device, an active layer is formed on a substrate, two ohmic electrodes are formed on the active layer, first side wall films are formed on both side walls of the ohmic electrodes, an upper stepped recess is formed by etching the active layer using the first side wall films as a mask, a second side wall films are formed in the upper stepped recess adjacent the first side wall films, a lower stepped recess is formed by etching the upper stepped recess using the second side wall films as a mask, a T-shaped gate is formed on the lower stepped recess and the second side wall films, the first side wall film and the second side wall film on one ohmic electrode are removed, and metal is formed at least on one ohmic electrode and on the active layer where the first and second side wall films are removed in ohmic contact with the electrode and the active layer.

According to a method of the present invention for fabricating a semiconductor device, an active layer is formed on a substrate, two ohmic electrodes are formed on the active layer, an upper stepped recess is formed by etching the active layer using the two ohmic electrodes as a mask, side wall films are formed on the side walls of the ohmic electrodes and in the upper stepped recess, a lower stepped recess is formed by etching the upper stepped recess using the side wall films as a mask and a T-shaped gate is formed on the lower stepped recess and the side wall films.

According to the present invention, since the first side wall films are formed on the ohmic electrodes and the upper stepped recess is formed using the films as a mask, the width of the first side wall films is determined by the thickness of the ohmic electrode and the upper recess is formed in a self-alignment manner with the first side wall films.

According to the present invention, since the second side wall films are formed in contact with the first side wall films and the lower stepped recess is formed using the films as a mask and then the T-shaped gate electrode is formed, the width of the second side wall films are determined by the thickness of the ohmic electrode and the depth of the upper stepped recess and the lower stepped recess and the gate electrode is positioned in a self-alignment manner.

Since the gate electrode formed by the above-described method is positioned on the lower stepped recess and its upper ends are positioned on the second side wall films above the upper stepped recess like a peak, a gate area is increased, resulting in no increase in the gate resistance even because of miniaturization of the gate.

According to the present invention, since the widths of the first side wall films and the second side wall films are determined by the thickness of the respective ohmic electrodes and then the upper stepped recess, the lower stepped recess and the gate electrode are positioned in a self-alignment manner with them, when the plurality of ohmic electrodes have the same films thicknesses, the gate electrode, the lower stepped recess, the upper stepped recess and the ohmic electrode are symmetrically positioned.

Alternatively, when the plurality of ohmic electrodes have the different thicknesses, an offset amounts between the upper and lower stepped recesses, and the gate electrode are controlled by the thicknesses of the ohmic electrodes.

According to the present invention, since the first and second side wall films on one ohmic electrode side are removed after the T-shaped gate is formed and then ohmic metal is formed on one ohmic electrode and on the first and second side wall films, substantially one end of one ohmic electrode becomes an end of the ohmic metal formed thereon and then one ohmic electrode positioned close to the gate electrode.

According to the present invention, since the upper stepped recess is formed using the ohmic electrodes as a mask and the side wall films are formed on the ohmic electrode and the lower stepped recess is formed using the side wall films as a mask and then the T-shaped gate electrode is formed, the upper stepped recess is formed in a self-alignment manner with the ohmic electrode and the lower stepped recess and the gate electrode is formed in a self-alignment manner relative to the side wall films of the ohmic electrode, so that the distance between the ohmic electrodes is further reduced.

DETAILED DESCRIPTION OF THE PREFERRED EMBODIMENTS

Embodiments of the present invention will be described in detail in reference to the drawings hereinafter.

Figure 1A:
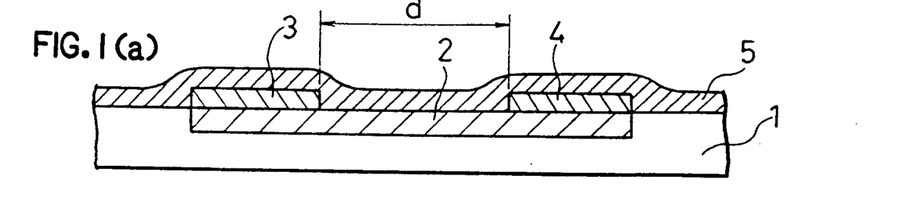
FIGS. 1(a) to 1(f) are cross-sectional views showing a fundamental method for fabricating a semiconductor device in accordance with the present invention.

FIG. 1(a) to 1(f) illustrate steps of a fundamental method for fabricating a semiconductor device in accordance with the present invention. In FIG. 1(a), a semi-insulating substrate 1 is formed of GaAs or the like. An active layer 2 having an n type impurity is formed in the surface of the GaAs substrate 1. A source electrode 3 and a drain electrode 4 making ohmic contact are formed on the active layer 2. Reference numeral 5 designates an insulating films. First side wall films 5a and 5b are formed on respective side walls of the source electrode 3. First side wall films 5c and 5d are formed on respective side walls of the drain electrode 4. Reference numeral 7 designates an upper recess of a stepped recess. First resist patterns 6a and 6b are used for forming the upper recess 7. Second side wall films 8a and 8b are formed in contact with the first side wall films 5a and 5b on the source electrode 3. Second side wall films 8c and 8d are formed in contact with the first sidewall films 5c and 5d of the drain electrode 4. Reference numeral 9 designates a lower recess of the stepped recess. Second resist patterns 10a and 10b are used for forming the lower stepped recess 9. Reference numerals 11a, 11b and 11c designate gate electrode metals and reference numeral 11 designates a gate electrode.

Next, the fundamental fabricating method of the present invention will be described hereinafter in reference to the drawings.

First, referring to FIG. 1(a), for example $Si_{29}+$ ions are implanted in the semi-insulating substrate 1 formed of GaAs or the like of a surface by an ion implantation and then the active layer 2 is formed with such a concentration distribution that the implanted surface of the substrate has a high dopant concentration and an opposed rear surface thereof has a low dopant concentration. Thereafter, the source electrode 3 and the drain electrode 4 having the same thickness ($t_1$) are formed of metal such as Au-Ge-Ni in ohmic contact with the active layer 2 and spaced apart from each other by a predetermined dimension (d). Then, the insulating films 5 comprising a silicon dioxide film, a silicon nitride film or the like is deposited on the whole surface to cover the source electrode 3 and the drain electrode 4.

Figure 1B:
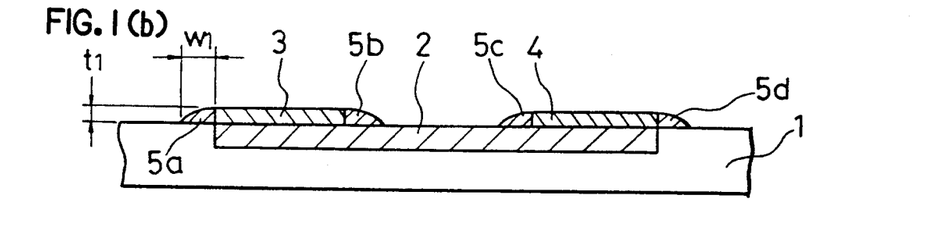

Then, referring to FIG. 1(b), the insulating film 5 is etched away by dry etching such as RIE (reactive ion etching) and the etching is continued until the surfaces of the source electrode 3 and the drain electrode 4 are exposed, so that the first side wall films 5a and 5b, and 5c and 5d are formed on respective side walls of the source electrode 3 and the drain electrode 4, respectively.

In this case, since the insulating film 5 and the ohmic electrodes 3 and 4 are formed of different materials, the etching end point can be easily detected by observing plasma emissions or the etched material.

Figure 2:
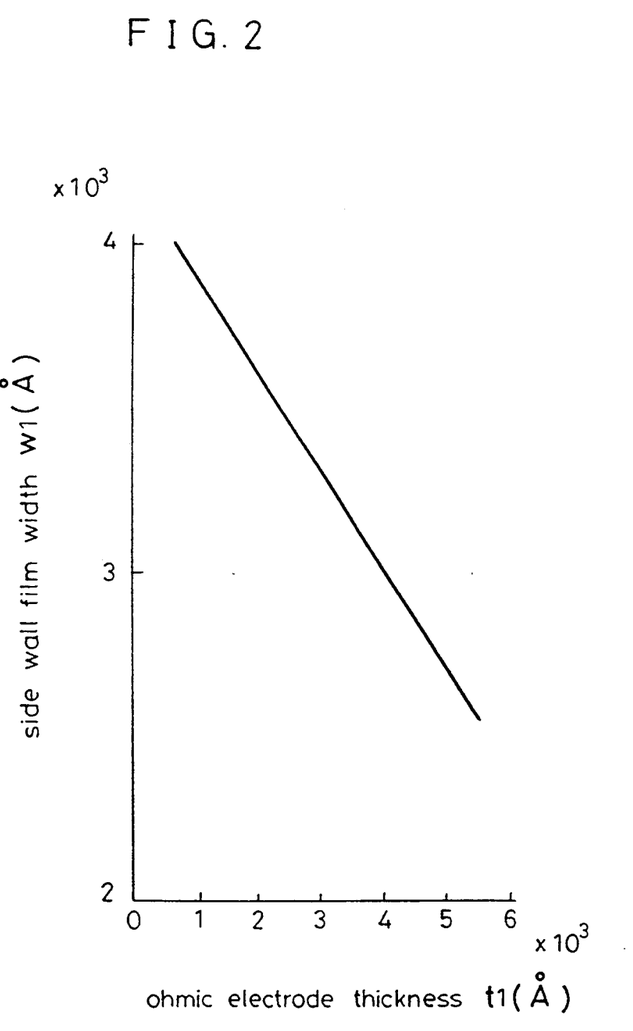
FIG. 2 is a view showing experimental data representing the dependency of the side wall width on the thickness of an ohmic electrode for explaining the present invention.

FIG. 2 is a graph showing experimental data representing dependency of the side wall width on the thickness of the ohmic electrode. When the thickness of the source electrode 3 and the drain electrode 4 is represented by $t_1$ and the width of the first side wall film is represented by $w_1$, if the thickness of the insulating film 5 is several thousand angstroms, then $t_1$ and $w_1$ are closely related as shown in FIG. 2. Therefore, the side wall film width ($w_1$) can be well controlled by the ohmic electrode thickness ($t_1$). For example, when the thickness $t_1$ of the ohmic electrode is 4000 angstroms, the width $w_1$ of the first side wall film is approximately 3000 angstroms.

Figure 1C:
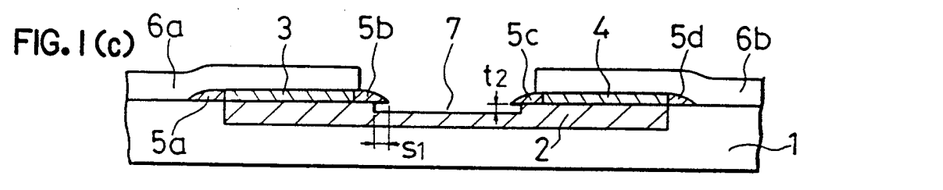

Then, referring to FIG. 1(c), a resist is formed on the whole surface and then the resist patterns 6a and 6b having an opening between the source electrode 3 and the drain electrode 4 are formed by photolithography.

Since the first side wall films 5a and 5d and the ohmic electrodes 4 and 5 can serve as an etching mask, if at least one end of each of the resist patterns 6a and 6b exposes a part of the active layer 2 on the substrate and the respective other ends cover the source electrode 3 and the drain electrode 4 or their respective side walls 5a and 5d, a large mask alignment margin is obtained when the resist patterns 6a and 6b are formed.

Then, referring to FIG. 1(c), the active layer 2 is etched in depth direction by $t_2$ by wet etching or dry etching using chlorine gas and the resist patterns 6a and 6b and the first side wall films 5b and 5c, together with the ohmic electrodes 3 and 4, as a mask, and then the upper recess 7 is formed. At this time, the upper recess 7 undercuts the side wall films 5b and 5c to some degree (S) because of lateral etching.

Then, the resists 6a and 6b are removed and an insulating film 8 which covers the source electrode 3 and drain electrode 4 is deposited on the whole surface of the substrate 1 again. Then, the film 8 is etched away until the surfaces of the source electrode 3 and the drain electrode 4 are exposed and then the second side wall films 8a to 8d are formed on the first insulating films 5a to 5d, respectively. In this case, the width ($w_2$) of the second side wall films 8b and 8c is determined by the sum of the thicknesses ($t_1$) of the ohmic electrode and the depth ($t_2$) of the upper stepped recess as shown in FIG. 2.

Figure 1D:
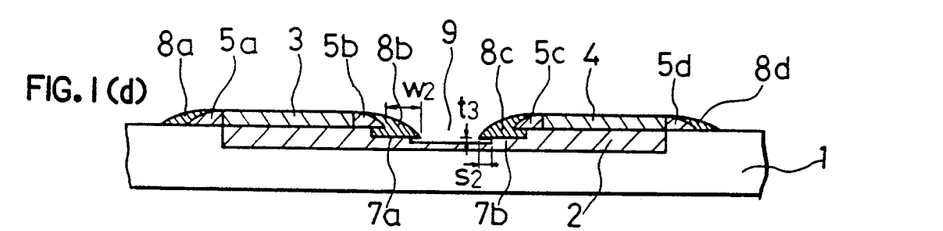

Then, referring to FIG. 1(d), all of the structure except where the lower stepped recess is formed is protected by a second resist pattern (not shown) and the lower stepped recess 9 is formed by etching the opening by a depth $t_3$ by wet etching or RIE using chlorine gas, using the second side wall films 8b and 8c as a mask. At this time, the lower stepped recess 9 undercuts the insulating films 8b and 8c by $S_2$ because of lateral etching. Then, the second resist is removed.

According to the second resist pattern, the edge of the opening may be positioned on the second side wall insulating films 8b and 8c or on the first side wall insulating films 5b and 5c or on the ohmic electrodes 3 and 4 like the first resist pattern, so that a large alignment margin is obtained for the patterning.

Figure 1E:
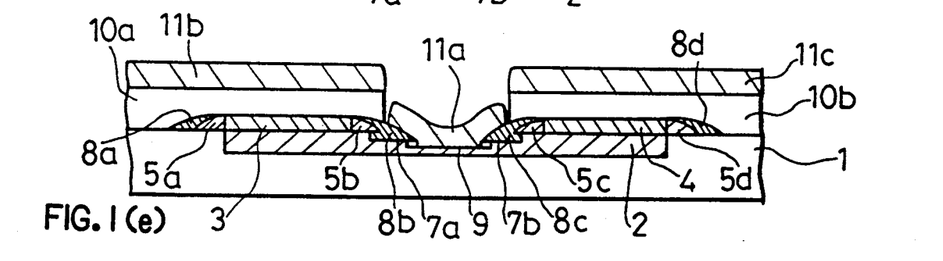

Then, referring to FIG. 1(e), in order to form the gate electrode, the third resist patterns 10a and 10b having an opening edge on the first side wall films 5b and 5c or the second side wall films 8b and 8c are provided and then a gate electrode metal is deposited on the whole surface of the substrate 1. The gate electrode metal portions 11b, 11c and 11a are spaced apart from each other on the resist patterns 10a, 10b and the lower stepped recess 9, respectively.

Figure 1F:
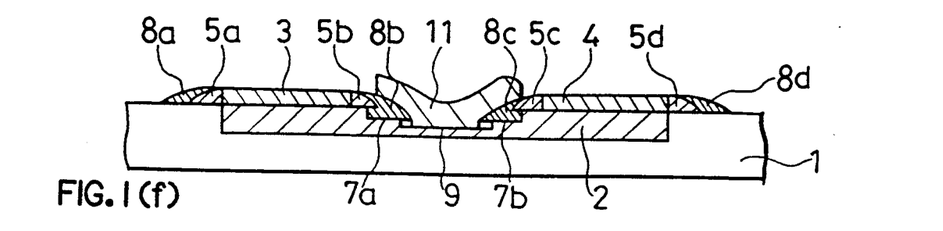

Then, referring to FIG. 1(f), the third resist 10a and 10b and the gate metal 11b and 11c are removed by lift-off and an FET having a self-aligned T-shaped gate electrode 11 formed from the gate metal portions in a on the lower stepped portion of two-stepped recess is completed.

According to the fabricating method shown in FIGS. 1(a)-1(f), a large mask alignment margin can be obtained when the first mask patterns 6a and 6b and the second mask patterns 8a and 8b are formed. In addition, when the third mask patterns 10a and 10b are formed, a mask alignment margin of the sum ($w_1+w_2$) of the first and second side wall films widths can be obtained. Therefore, according to this method, those patterns can be easily formed and the size of the upper and lower stepped recesses can achieve a desired value by adjusting the widths of the first and second side wall films regardless of the alignment precision of the exposure apparatus.

In this case, the distance between the ohmic electrode 3 or 4 and the gate electrode 11 is the sum of the first side wall films width $w_1$ and the second side wall films width $w_2$.

For example, when the thickness $t_1$ of the ohmic electrodes 3 and 4 is 0.4 micron and depths $t_2$ and $t_3$ of the upper and lower stepped recesses are 0.1 micron, the first and second side wall films widths $w_1$ and $w_2$ are approximately 0.3 micron and 0.26 micron, respectively. Therefore, when the distances between a position where the gate electrode is in contact with the lower stepped recess and the ohmic electrodes are $1_{GS}$ and $1_{GD}$, both $1_{GS}$ and $1_{GD}$ are 0.56 micron (=0.3 micron +0.26 micron), which is much smaller than the conventional example.

In addition, according to this fabricating method, the gate length can be easily reduced. For example, if the gate length lg is to be 0.2 micron, the distance d between the ohmic electrodes should be approximately 1.32 micron because $d=lg+2(w_1+w_2)$ and the above steps may be carried out.

As described above, since the upper stepped recess 7 and the lower stepped recess 9 are formed in a self-alignment manner with the ohmic electrodes 3 and 4 by using the first and second side wall films, the distance between the gate and the source and the distance between the gate and the drain can be determined like the prior art regardless of the alignment precision of the exposure apparatus and, especially, the source resistance can be reduced by reducing the distance between the source and the gate.

In addition, since the gate electrode 11 has a T-shaped structure, even if the gate length is reduced, a cross-sectioned section area of the gate can be increased, resulting in no increase in the gate resistance and reliability of the device is assured.

Next, a method for fabricating a high power FET in accordance with a first embodiment of the present invention, will be described in reference to the drawings.

FIGS. 3(a)-3(f) are sectional views showing steps for fabricating a semiconductor device in accordance with a first embodiment of the present invention, more particularly, an FET having a stepped recess T-shaped offset gate structure. In FIGS. 3(a)-3(f), the same reference numerals as in FIGS. 1(a)-1(f). designate the same parts.

Figure 3A:
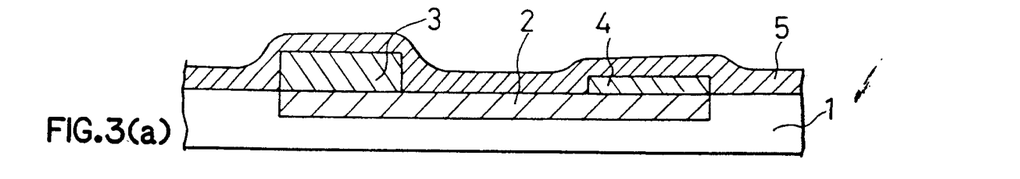
FIGS. 3(a) and 3(f) are cross-sectional views showing a method for fabricating a semiconductor device in accordance with a first embodiment of the present invention.
Figure 3B:
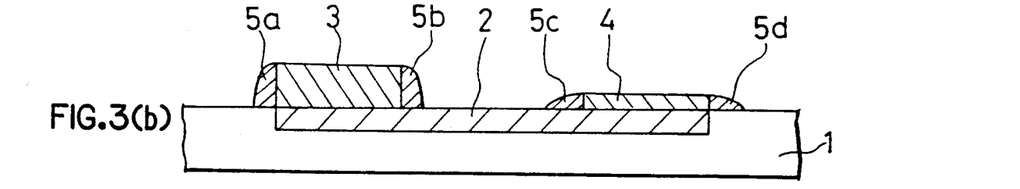
Figure 3C:
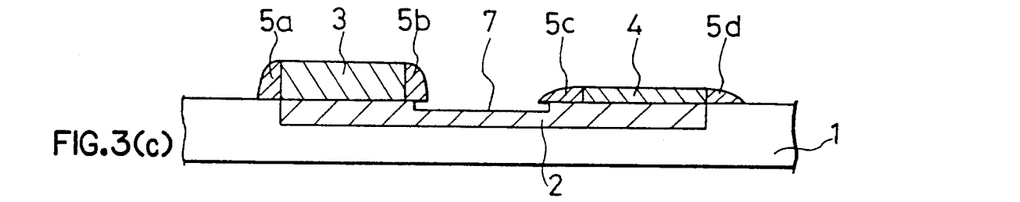
Figure 3D:
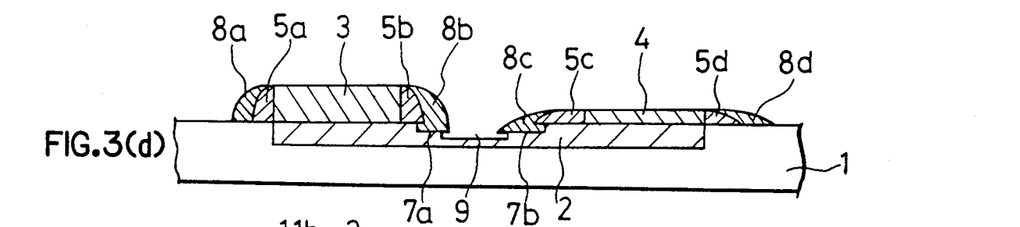
Figure 3E:
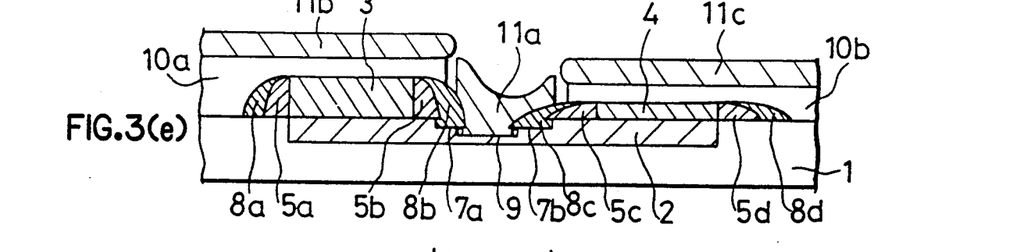

According to this embodiment of the present invention, the thicknesses of the source electrode 3 and the drain electrode 4 are differentiated from those obtained in the source and drain electrodes production step in the method shown in FIG. 1(a), as shown in FIG. 3(a), whereby the widths of the first side wall films 5a-5d are set at a value obtained from the relation shown in FIG. 2. In this embodiment, the source electrode 3 is thicker and the drain electrode 4 is thinner, whereby the widths of the first side wall films 5a and 5b on the source electrode 3 are reduced and the widths of the first side wall films 5c and 5d on the drain electrode 4 are increased as shown in FIG. 3(b).

Figure 3F:
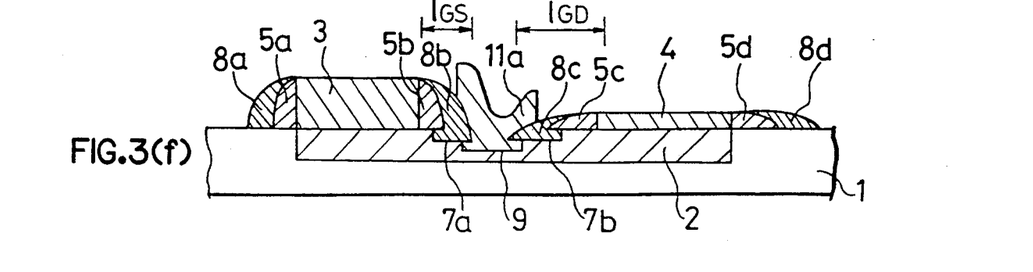

Thereafter, as shown in FIGS. 3(c) to 3(f), the same steps as in the fabricating method shown in FIG. 1 follow and a structure shown in FIG. 3(f) is obtained.

When the distances between the position where the gate electrode 11 is in contact with the lower stepped recess 9 and the source electrode 3 or the drain electrode 4 are represented by $1_{GS}$ and $1_{GD}$, the $1_{GS}$ and $1_{GD}$ can be controlled by the thicknesses of the source electrode 3 and the drain electrode 4 as shown by the relation in FIG. 2.

Therefore, according to this embodiment of the present invention, similar to the fabricating method shown in FIGS. 1(a)-1(f), the gate electrode 11 and the upper and lower stepped recesses can be formed in a self-alignment manner with the ohmic electrodes 3 and 4 at predetermined offset intervals and the distance between the ohmic electrodes 3 and 4 and the gate electrode 11 and the gate resistance are reduced. Furthermore, in addition to the above effects, the distance between the gate and the drain can be larger than that between the gate and the source, whereby the gate-to-drain breakdown voltage can be enhanced and then a high output power FET can be produced.

Next, a second embodiment of the present invention, will be described in reference to the drawings hereinafter.

Figure 4A:
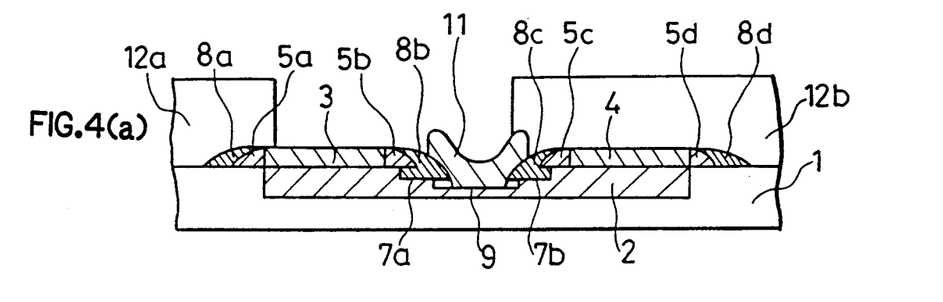
FIGS. 4(a) to 4(c) are cross-sectional views showing a method for fabricating a semiconductor device in accordance with a second embodiment of the present invention.
Figure 4B:
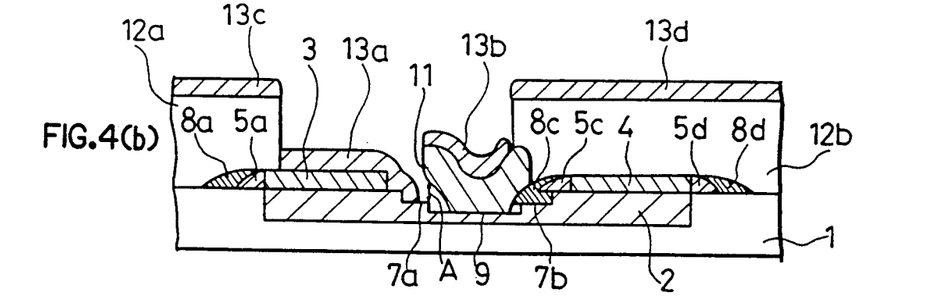
Figure 4C:
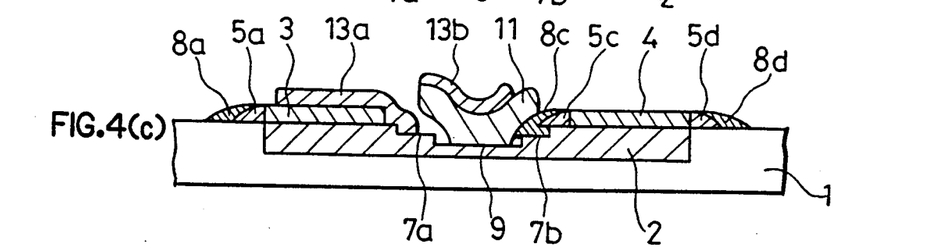

FIGS. 4(a)-4(c) are views showing a fabricating method in accordance with the second embodiment of the present invention. In FIGS. 4(a)-4(c), the same reference numerals as in FIGS. 1(a)-1(f) designate the same parts. Reference numerals 12a and 12b designate resists and reference numerals 13a to 13d designate materials forming ohmic contacts.

The fabricating method in accordance with this embodiment of the present invention will be described hereinafter.

Referring to FIG. 4(a), after the step shown in FIG. 1(f), the resist patterns 12a and 12b are provided so that the first side wall films 5b and the second side wall films 8b and parts of the surface of the source electrode 3 and the gate electrode 11 are exposed.

Then, referring to FIG. 4(b), the first side wall films 5b and the second side wall films 8b are etched away using the resist patterns 12a and 12b as a mask and then the ohmic materials 13a to 13d are deposited on the whole surface of the substrate 1. At this time, the deposited ohmic materials are formed so that they are thinner than the distance A indicated in the figure, between the peaked part of the T-shaped gate and the upper stepped recess 7a. Thus, the ohmic materials 13c, 13a, 13b and 13d are spaced from each other on the resist 12a, on the source electrode 3 and the upper stepped recess 7a on the source side, on the T-shaped gate 11, and on the resist 12b, respectively.

Then, referring to FIG. 4(c), the resists 12a and 12b and the ohmic materials 13c and 13d are removed by lift-off. Since the source electrode part comprises not only the source electrode 3 but also the ohmic electrode 13a extending from the surface of the source electrode to the upper stepped recess 7a, the width of the space at the peaked part of the T-shaped gate electrode 11 is the gate-to-source distance, resulting in a gate-to-source distance considerably reduced relative to the semiconductor device fabricated by the method shown in FIGS. 1(a)-1(f).

Therefore, in this second embodiment of the present invention the gate electrode-to-source electrode distance is reduced, resulting in a reduced source resistance, in addition to the advantages of the semiconductor device fabricated by the method shown in FIGS. 1(a)-1(f). In addition, since the ohmic metal 13b is also provided on a part of the gate electrode 11, the resistance of the gate electrode can be further reduced, resulting in a further improvement high frequency characteristics.

Next, a third embodiment of the present invention will be described in reference to the drawings hereinafter.

FIGS. 5(a)-5(e) are views showing steps of a method for fabricating a semiconductor device in accordance with a third embodiment of the present invention. In FIGS. 5(a)-5(e), the same reference numerals as in FIGS. 1(a-1(f) designate the same parts and their descriptions are omitted. The fabricating method in accordance with this embodiment of the present invention will be described hereinafter.

Figure 5A:
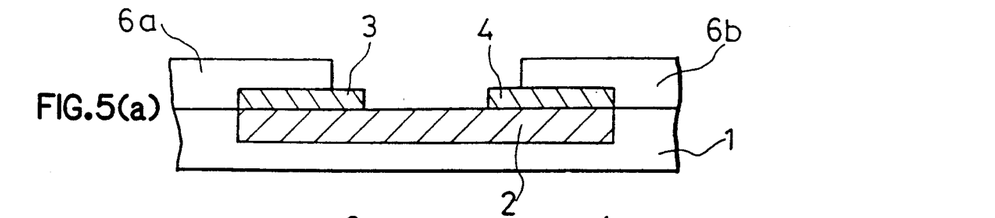
FIGS. 5(a) to 5(e) are cross-sectional views showing a method for fabricating a semiconductor device in accordance with a third embodiment of the present invention.

First, referring to FIG. 5(a), the active layer 2 is formed in the semi-insulating substrate 1 formed of GaAs or the like by such as ion implantation and then the source electrode 3 and the drain electrode 4 are formed on the active layer 2. Thereafter, the resist patterns 6a and 6b are formed so that portions of the upper surfaces of the source electrode 3 and the drain electrode 4 and the surface of the active layer 2 are exposed.

Figure 5B:
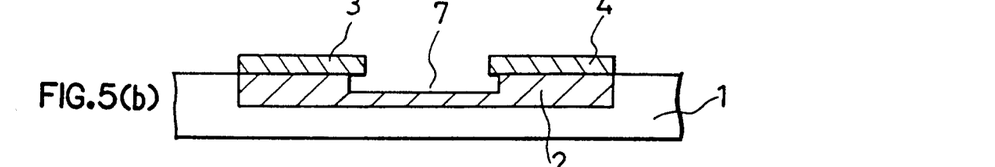

Then, referring to FIG. 5(b), the active layer 2 is etched away using the source electrode 3, the drain electrode 4 and resist patterns 6a and 6b as a mask by wet etching or RIE using chlorine group gas to form the upper stepped recess 7.

Figure 5C:
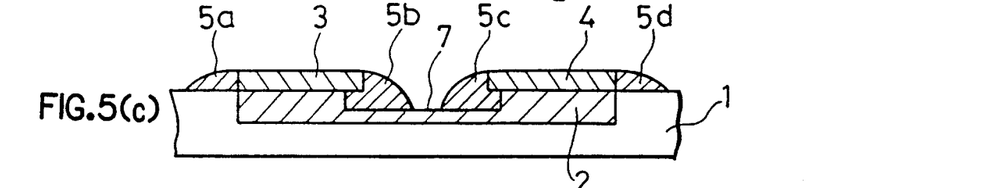

Then, referring to FIG. 5(c), similar to the fabricating method shown in FIG. 1(b), an insulating films are formed on the whole surface and then it is etched away until the source and drain electrodes 3 and 4 are exposed to form the side wall films 5a and 5b and 5c and 5d on the side walls of the source and the drain electrodes 3 and 4, respectively.

Figure 5D:
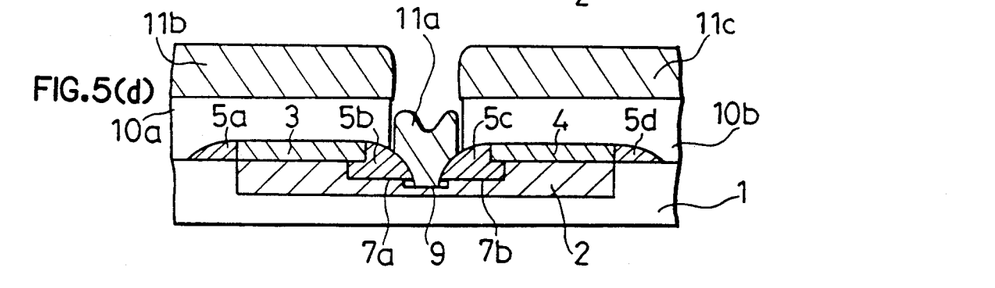

Then, referring to FIG. 5(d), the resist patterns 10a and 10b used for forming the gate electrode are formed and then the active layer 2 is etched using the patterns 10a and 10b as a mask. Then the lower stepped recess 9 is formed and the gate electrode metal is deposited.

Figure 5E:
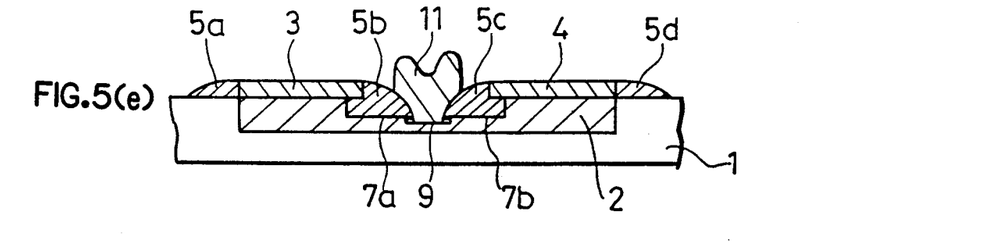

Then, referring to FIG. 5(e), the resist patterns 10a and 10b and the gate electrode metals 11b and 11c are removed by a lift-off to complete an element having the T-shaped gate 11 on the lower stepped recess 9.

This third embodiment has formed the upper stepped recess 7 in a self-alignment manner with the source electrode 3 and the drain electrode 4. This step reduces the distance between the gate and the source and the distance between the gate and the drain by the width of the first side wall films as compared with the semiconductor device fabricated by the method shown in FIGS. 1(a)-1(f), resulting in a further increased operation speed. In addition the omission of the step for forming the first side wall films simplifies the entire fabricating process as compared with the method shown in FIGS. 1(a)-1(f).

Figure 6:
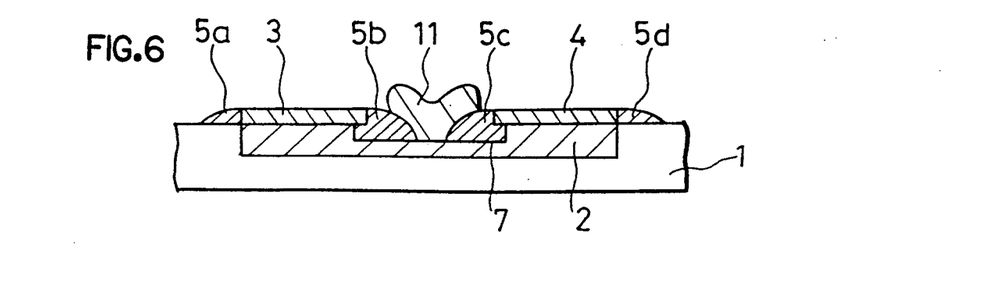
FIG. 6 is a cross-sectional view showing a semiconductor device in accordance with a fourth embodiment of the present invention.

If the same fabricating method as the fabricating method shown in FIGS. 1(a-1(f) is used without forming the lower stepped recess 7 after FIG. 5(c) in this third embodiment of the present invention, the FET having a self-alignment one step recess T-shaped gate structure can be formed as shown in FIG. 6. More specifically, FIG. 6 is a view showing an element structure fabricated in accordance with a fourth embodiment of the present invention which is a variation of the third embodiment of the present invention. In FIG. 6, the same reference numerals as in FIGS. 5(a-5(e) designate the same parts. Even in this one step recess, similar to the previously described embodiments of the present invention, the recess 7 is formed in a self-alignment manner with the ohmic electrodes 3 and 4 and the T-shaped gate electrode 11 is formed in a self-alignment manner with the ohmic electrodes 3 and 4 and the side wall films 5b and 5c formed in the recess. In addition, the distance between the source electrode 3 or drain electrode 4 and the gate electrode can be easily controlled by the thickness of the source and drain electrodes, resulting in a semiconductor device producing high speed operation with high reliability.

Although GaAs is used as the semi-insulating substrate in the above embodiments of the present invention, another group III-V compound semiconductor or another semi-insulating substrate or a semiconductor substrate may be used. In addition, the substrate may be formed of a plurality of layers.

As described above, according to the present invention, since the upper and lower recesses and the gate electrode are formed using the side wall films formed adjacent the ohmic electrode as a mask, the upper and lower recesses and the gate electrode can be precisely formed in a self-alignment manner with the side wall films regardless of mask alignment precision of an exposure apparatus used in photolithography. This results in a reduced gate electrode to ohmic electrode distance, a reduced gate to source resistance, and thereby a high speed operation device. In addition, since the gate electrode can be T shaped, the gate resistance can be reduced and high reliability of the gate can be assured. Furthermore, since multiple-step recesses are provided, the breakdown voltage of the element can be enhanced. Therefore, the recesses and the gate electrode can be precisely formed in a self-alignment manner using side wall films at the ohmic electrodes without precise photolithography, whereby an FET having a high breakdown voltage and a high speed performance can be obtained by a simple fabricating method.

When the thicknesses of the ohmic electrodes are different, for example when the drain electrode is thinner than the source electrode, the distance between the gate and the drain can be larger than the distance between the gate and the source, thereby resulting in a reduced gate to source resistance and a reduced gate to drain breakdown voltage and this results a high power output of the FET.

According to the present invention, the first and second side wall films on source electrode side are removed and ohmic metal is then formed on one ohmic electrode and on the active layer where the first and second side wall films are removed, after the T-shaped gate electrode is formed. Therefore, the substantial distance between the source electrode and the gate electrode is reduced, resulting in a reduced source resistance and a reduced gate resistance, and an increased operation speed and an improved high frequency characteristic.

According to the present invention, the stepped recess is formed using the ohmic electrodes as a mask, the side wall films are formed adjacent the ohmic electrodes, the lower stepped recess is formed using the side wall films as a mask and a T-shaped electrode is then formed. Therefore, the number of its fabricating steps is reduced and this results in a reduced source to gate distance, a reduced drain to gate distance and a high speed operation FET.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for fabricating a field effect transistor having a T-shaped gate electrode disposed in a stepped recess comprising:
   forming an active layer in a semiconductor substrate at a surface of said substrate;
   forming spaced apart first and second ohmic electrodes on the surface on said active layer;
   forming spaced apart first side wall films on the surface at and contacting opposed side walls of each of said first and second ohmic electrodes between said first and second ohmic electrodes;
   forming a first recess in said substrate at the surface by etching said active layer using said first side wall films as a mask;
   forming respective spaced apart second side wall films on said active layer in said first recess contacting respective first side wall films;
   forming a second recess within and narrower than the first recess by etching said active layer in the first recess using said second side wall films as a mask; and
   forming a T-shaped gate in the second recess on said active layer contacting at least some of said second side wall films.

2. A method for fabricating a field effect transistor in accordance with claim 1 wherein said substrate is a semi-insulating substrate.

3. A method for fabricating a field effect transistor in accordance with claim 2 wherein said substrate is GaAs.

4. A method for fabricating a field effect transistor in accordance with claim 1 including, after forming said T-shaped gate, removing said first side wall and the adjacent second side wall film at said first ohmic electrode and between said first and second ohmic electrodes and depositing a metal on aid first ohmic electrode and on the active layer where said first and second side wall films are removed, in ohmic contact with said first ohmic electrode and active layer.

5. A method for fabricating a field effect transistor in accordance with claim 4 wherein said one ohmic electrode is a source electrode.

6. A method for fabricating a field effect transistor having a T-shaped gate electrode disposed in a stepped recess comprising:
   forming an active layer in a semiconductor substrate at a surface of said substrate;
   forming spaced apart first and second ohmic electrodes on the surface on said active layer;
   forming a recess in said substrate at the surface between said first and second electrodes by etching said active layer using said first and second ohmic electrodes as an etching mask;
   forming spaced apart side wall films on and contacting opposed side walls of said first and second ohmic electrodes in the first recess;
   forming a second recess within and narrower than the first recess by etching said active layer in the first recess using said side wall films as a mask; and
   forming a T-shaped gate in the second recess on said active layer contacting at least some of said side wall films.

7. A method for fabricating a field effect transistor in accordance with claim 6 wherein said substrate is a semi-insulating substrate.

8. A method for fabricating a field effect transistor in accordance with claim 6 wherein said substrate is GaAs.

9. A method for fabricating a field effect transistor having a T-shaped gate electrode disposed in a stepped recess comprising:
   forming an active layer in a semiconductor substrate at a surface of said substrate;
   forming spaced apart first and second ohmic electrodes on the surface on said active layer;
   forming a recess in said substrate at the surface between said first and second electrodes by etching said active layer using said first and second ohmic electrodes as an etching mask;
   forming spaced apart side wall films on said active layer and contacting opposed side walls of said first and second ohmic electrodes and in the recess; and
   forming a T-shaped gate in said recess on said active layer contacting at least some of said side wall films.

10. A method for fabricating a field effect transistor in accordance with claim 1 including forming said first and second electrodes of different thicknesses on the surface of said active layer.

11. A method for fabricating a field effect transistor in accordance with claim 1 including forming said first side walls by depositing a first electrically insulating layer on said first and second ohmic electrodes and on said active layer between said first and second electrodes and etching said first electrically insulating layer until said first and second electrodes are exposed.

12. A method for fabricating a field effect transistor in accordance with claim 11 including dry etching said first electrically insulating layer.

13. A method for fabricating a field effect transistor in accordance with claim 1 including forming said second side walls by depositing a second electrically insulating layer on said first and second ohmic electrodes and on said active layer between said first and second electrodes and etching said second electrically insulating layer until said first and second electrodes are exposed.

14. A method for fabricating a field effect transistor in accordance with claim 13 including dry etching said second electrically insulating layer.

15. A method for fabricating a field effect transistor in accordance with claim 6 including forming said side walls by depositing an electrically insulating layer on said first and second ohmic electrodes and on said active layer between said first and second electrodes and etching said electrically insulating layer until said first and second electrodes are exposed.

16. A method for fabricating a field effect transistor in accordance with claim 15 including dry etching said electrically insulating layer.

17. A method for fabricating a field effect transistor in accordance with claim 9 including forming said side walls be depositing an electrically insulating layer on said first and second ohmic electrodes and on said active layer between said first and second electrodes and etching said electrically insulating layer until said first and second electrodes are exposed.

18. A method for fabricating a field effect transistor in accordance with claim 17 including dry etching said electrically insulating layer.

* * * * *

UNITED STATES PATENT AND TRADEMARK OFFICE
CERTIFICATE OF CORRECTION

PATENT NO. : 5,240,869

DATED : August 31, 1993

INVENTOR(S) : Mitsunori Nakatani

It is certified that error appears in the above-identified patent and that said Letters Patent is hereby corrected as shown below:

Claim 1, column 11, line 47, after "layer" insert --and--.

Claim 4, column 11, line 64, after "wall" insert --film--;

"        ", line 67, change "aid" to --said--.

Claim 17, column 14, line 6, change "be" to --by--.

Signed and Sealed this

Nineteenth Day of April, 1994

Attest:

BRUCE LEHMAN

Attesting Officer

Commissioner of Patents and Trademarks